US012776715B2

(12) United States Patent
Jakobi et al.

(10) Patent No.: US 12,776,715 B2
(45) Date of Patent: Oct. 27, 2026

(54) POWER SEMICONDUCTOR MODULE AND POWER ELECTRONICS DEVICE

(71) Applicant: Infineon Technologies AG, Neubiberg (DE)

(72) Inventors: Waldemar Jakobi, Soest (DE); Christoph Koch, Salzkotten (DE); Tomas Manuel Reiter, Munich (DE); Christian Schweikert, Munich (DE)

(73) Assignee: Infineon Technologies AG, Neubiberg (DE)

( * ) Notice: Subject to any disclaimer, the term of this patent is extended or adjusted under 35 U.S.C. 154(b) by 621 days.

(21) Appl. No.: 18/124,223

(22) Filed: Mar. 21, 2023

(65) Prior Publication Data

US 2024/0322697 A1 Sep. 26, 2024

(51) Int. Cl.
*H02M 3/335* (2006.01)
*H02M 7/00* (2006.01)
*H10W 70/40* (2026.01)

(52) U.S. Cl.
CPC ....... *H02M 3/33571* (2021.05); *H02M 7/003* (2013.01); *H10W 70/415* (2026.01); *H10W 70/429* (2026.01); *H10W 70/481* (2026.01)

(58) Field of Classification Search
None
See application file for complete search history.

(56) References Cited

U.S. PATENT DOCUMENTS

| | | | |
|---|---|---|---|
| 6,867,072 | B1 | 3/2005 | Shiu et al. |
| 8,531,067 | B2 | 9/2013 | Tunzini et al. |
| 9,368,434 | B2 | 6/2016 | Otremba |
| 9,736,925 | B2 | 8/2017 | Ziglioli |
| 9,818,677 | B2 | 11/2017 | Liu et al. |
| 10,403,601 | B2 | 9/2019 | Im et al. |
| 11,037,856 | B2 | 6/2021 | Neugirg et al. |
| 11,075,137 | B2 | 7/2021 | Lin et al. |

(Continued)

FOREIGN PATENT DOCUMENTS

| | | | |
|---|---|---|---|
| CN | 105703631 | A | 6/2016 |
| CN | 215578506 | U | 1/2022 |
| DE | 102020208438 | A1 | 1/2022 |

*Primary Examiner* — Brent A. Fairbanks
*Assistant Examiner* — Michael Anguiano
(74) *Attorney, Agent, or Firm* — Murphy, Bilak & Homiller, PLLC

(57) ABSTRACT

A power semiconductor module includes: an electrically insulative frame; half bridge circuits housed in the electrically insulative frame, each half bridge circuit including one or more high-side power semiconductor dies and one or more low-side power semiconductor dies; a first structured metal frame embedded in the electrically insulative frame and electrically connected to a drain or collector terminal of the one or more high-side power semiconductor dies of each half bridge circuit; a second structured metal frame embedded in the electrically insulative frame and electrically connected to a source or emitter terminal of the one or more low-side power semiconductor dies of each half bridge circuit; and first openings in the electrically insulative frame that expose part of the first structured metal frame or part of the second structured metal frame at opposing first and second sidewalls of the electrically insulative frame and between adjacent ones of the half bridge circuits.

26 Claims, 14 Drawing Sheets

(56) References Cited

U.S. PATENT DOCUMENTS

| | | | | |
|---|---|---|---|---|
| 2006/0290689 | A1* | 12/2006 | Grant | H01L 24/49 257/734 |
| 2009/0140403 | A1* | 6/2009 | Lim | H01L 24/83 257/676 |
| 2009/0294936 | A1* | 12/2009 | Liu | H01L 24/38 438/122 |
| 2012/0256194 | A1 | 10/2012 | Yoshihara et al. | |
| 2014/0091449 | A1 | 4/2014 | Fernando et al. | |
| 2017/0025335 | A1 | 1/2017 | Liu et al. | |
| 2018/0218960 | A1 | 8/2018 | Takahagi et al. | |
| 2018/0329002 | A1 | 11/2018 | Lorenz et al. | |
| 2019/0157190 | A1* | 5/2019 | Fuergut | H01L 23/49548 |
| 2019/0304946 | A1 | 10/2019 | Cottet et al. | |
| 2020/0266135 | A1 | 8/2020 | Yano et al. | |
| 2020/0273781 | A1 | 8/2020 | Scharf et al. | |
| 2021/0020604 | A1 | 1/2021 | Nakamura | |
| 2021/0104957 | A1* | 4/2021 | Naeve | H01L 24/20 |
| 2021/0313296 | A1 | 10/2021 | Raimann et al. | |
| 2021/0344276 | A1 | 11/2021 | Raimann et al. | |
| 2021/0358835 | A1 | 11/2021 | Inokuchi | |
| 2022/0005755 | A1 | 1/2022 | Scharf et al. | |
| 2022/0115246 | A1 | 4/2022 | Higashi et al. | |
| 2022/0115351 | A1 | 4/2022 | Yoshihara | |
| 2022/0208654 | A1 | 6/2022 | Baek et al. | |
| 2022/0208685 | A1 | 6/2022 | Takahashi et al. | |
| 2022/0238413 | A1 | 7/2022 | Grassmann | |
| 2022/0301955 | A1 | 9/2022 | Kaneko | |
| 2022/0301993 | A1 | 9/2022 | Kimura et al. | |
| 2022/0301997 | A1 | 9/2022 | Miyakoshi | |
| 2022/0399241 | A1 | 12/2022 | Itoh | |
| 2022/0406745 | A1 | 12/2022 | Pavlicek et al. | |
| 2023/0052830 | A1 | 2/2023 | Prajuckamol et al. | |
| 2023/0060830 | A1 | 3/2023 | Kim et al. | |
| 2023/0067156 | A1 | 3/2023 | Yamada | |
| 2023/0077964 | A1 | 3/2023 | Yoshihara et al. | |
| 2023/0084150 | A1 | 3/2023 | Nakazawa | |
| 2023/0135461 | A1 | 5/2023 | Aoki et al. | |
| 2023/0178461 | A1 | 6/2023 | Hama et al. | |
| 2023/0207431 | A1 | 6/2023 | Yanagida et al. | |
| 2023/0335460 | A1 | 10/2023 | Sato | |
| 2023/0361088 | A1 | 11/2023 | Nikitin et al. | |
| 2023/0411254 | A1 | 12/2023 | Nikitin et al. | |
| 2024/0007015 | A1* | 1/2024 | Weis | B60K 1/00 |
| 2024/0071851 | A1 | 2/2024 | Tremlett et al. | |
| 2024/0071892 | A1 | 2/2024 | Kim et al. | |
| 2024/0079297 | A1 | 3/2024 | Luniewski et al. | |
| 2024/0087995 | A1 | 3/2024 | Otremba et al. | |

* cited by examiner

POWER SEMICONDUCTOR MODULE AND POWER ELECTRONICS DEVICE

BACKGROUND

A power semiconductor module typically includes power semiconductor dies electrically interconnected to form a power converter component of a power electronics device. The power semiconductor module is typically electrically connected to a DC link capacitor via a DC link. Screws to connect the DC link to the power semiconductor module, the power terminals of the power semiconductor module, and metal (e.g., copper) tracks of substrate(s) included in the power semiconductor module each increase the stray inductance of the module. The stray inductance leads to overvoltage during the turn off event of power transistors included in the power semiconductor module or the turn off event of parallel switched diodes/body diodes.

Hence, there is a need form a power semiconductor module and power electronics device with lower stray inductance.

SUMMARY

According to an embodiment of a power semiconductor module, the power semiconductor module comprises: an electrically insulative frame; a plurality of half bridge circuits housed in the electrically insulative frame, each half bridge circuit comprising one or more high-side power semiconductor dies and one or more low-side power semiconductor dies; a first structured metal frame embedded in the electrically insulative frame and electrically connected to a drain or collector terminal of the one or more high-side power semiconductor dies of each half bridge circuit; a second structured metal frame embedded in the electrically insulative frame and electrically connected to a source or emitter terminal of the one or more low-side power semiconductor dies of each half bridge circuit; and a plurality of first openings in the electrically insulative frame that expose part of the first structured metal frame or part of the second structured metal frame at opposing first and second sidewalls of the electrically insulative frame and between adjacent ones of the half bridge circuits.

According to another embodiment of a power semiconductor module, the power semiconductor module comprises: an electrically insulative frame; a half bridge circuit housed in the electrically insulative frame and comprising one or more high-side power semiconductor dies and one or more low-side power semiconductor dies; a first structured metal frame embedded in the electrically insulative frame and electrically connected to a drain or collector terminal of the one or more high-side power semiconductor dies; a second structured metal frame embedded in the electrically insulative frame and electrically connected to a source or emitter terminal of the one or more low-side power semiconductor dies; and a plurality of first openings in the electrically insulative frame that expose part of the first structured metal frame or part of the second structured metal frame at opposing first and second sidewalls of the electrically insulative frame.

According to an embodiment of a power electronics device, the power electronics device comprises: a power semiconductor module comprising: an electrically insulative frame; a plurality of half bridge circuits housed in the electrically insulative frame and each comprising one or more high-side power semiconductor dies and one or more low-side power semiconductor dies; a first structured metal frame embedded in the electrically insulative frame and electrically connected to a drain or collector terminal of the one or more high-side power semiconductor dies of each half bridge circuit; a second structured metal frame embedded in the electrically insulative frame and electrically connected to a source or emitter terminal of the one or more low-side power semiconductor dies of each half bridge circuit; a plurality of first openings in the electrically insulative frame that expose part of the first structured metal frame or part of the second structured metal frame at opposing first and second sidewalls of the electrically insulative frame and between adjacent ones of the half bridge circuits; a first busbar attached to the part of the first structured metal frame or the part of the second structured metal frame exposed by the plurality of first openings in the electrically insulative frame; and at least one lid attached to a surface of the electrically insulative frame with the plurality of first openings, wherein the at least one lid and the electrically insulative frame form an enclosure for the plurality of half bridge circuits, wherein the first busbar is embedded in the at least one lid, interposed between the at least one lid and the electrically insulative frame, or disposed above the at least one lid; and a DC link capacitor having a first terminal electrically connected to the drain or collector terminal of the one or more high-side power semiconductor dies of each half bridge circuit and a second terminal electrically connected to the source or emitter terminal of the one or more low-side power semiconductor dies of each half bridge circuit.

Those skilled in the art will recognize additional features and advantages upon reading the following detailed description, and upon viewing the accompanying drawings.

BRIEF DESCRIPTION OF THE FIGURES

The elements of the drawings are not necessarily to scale relative to each other. Like reference numerals designate corresponding similar parts. The features of the various illustrated embodiments can be combined unless they exclude each other. Embodiments are depicted in the drawings and are detailed in the description which follows.

DETAILED DESCRIPTION

The embodiments described herein provide a power semiconductor module with reduced stray inductance and a power electronics device that includes the power semiconductor module. The power semiconductor module includes an electrically insulative frame and at least one half bridge circuit housed in the electrically insulative frame. A first structured metal frame embedded in the electrically insulative frame is electrically connected to a drain or collector terminal of the high-side power semiconductor die(s) of each half bridge circuit. A second structured metal frame embedded in the electrically insulative frame is electrically connected to a source or emitter terminal of the low-side power semiconductor die(s) of each half bridge circuit.

Stray inductance of the power semiconductor module is reduced by including openings in the electrically insulative frame. The openings expose part of the first structured metal frame and/or part of the second structured metal frame at opposing first and second sidewalls of the electrically insulative frame. If the power semiconductor module includes more than one half bridge circuit, the openings may also expose part of the first structured metal frame and/or part of the second structured metal frame between adjacent ones of the half bridge circuits.

A busbar may be connected to the first structured metal frame and/or the second structured metal frame through the openings in the electrically insulative frame, thereby lowering the stary inductance of the power semiconductor module. In the case of a first busbar connected to the first structured metal frame and a second busbar connected to the second structured metal frame, the busbars may be laterally spaced apart from one another or vertically stacked one above the other and dielectrically insulated from one another. Each busbar may be embedded in a lid of the power semiconductor module, interposed between the lid and the electrically insulative frame, or disposed above the lid.

Described next, with reference to the figures, are exemplary embodiments of the power semiconductor module with reduced stray inductance, a power electronics device that includes the power semiconductor module, and methods of producing the power semiconductor module. Any of the power semiconductor module embodiments described herein may be used interchangeably unless otherwise expressly stated.

Figure 1A:
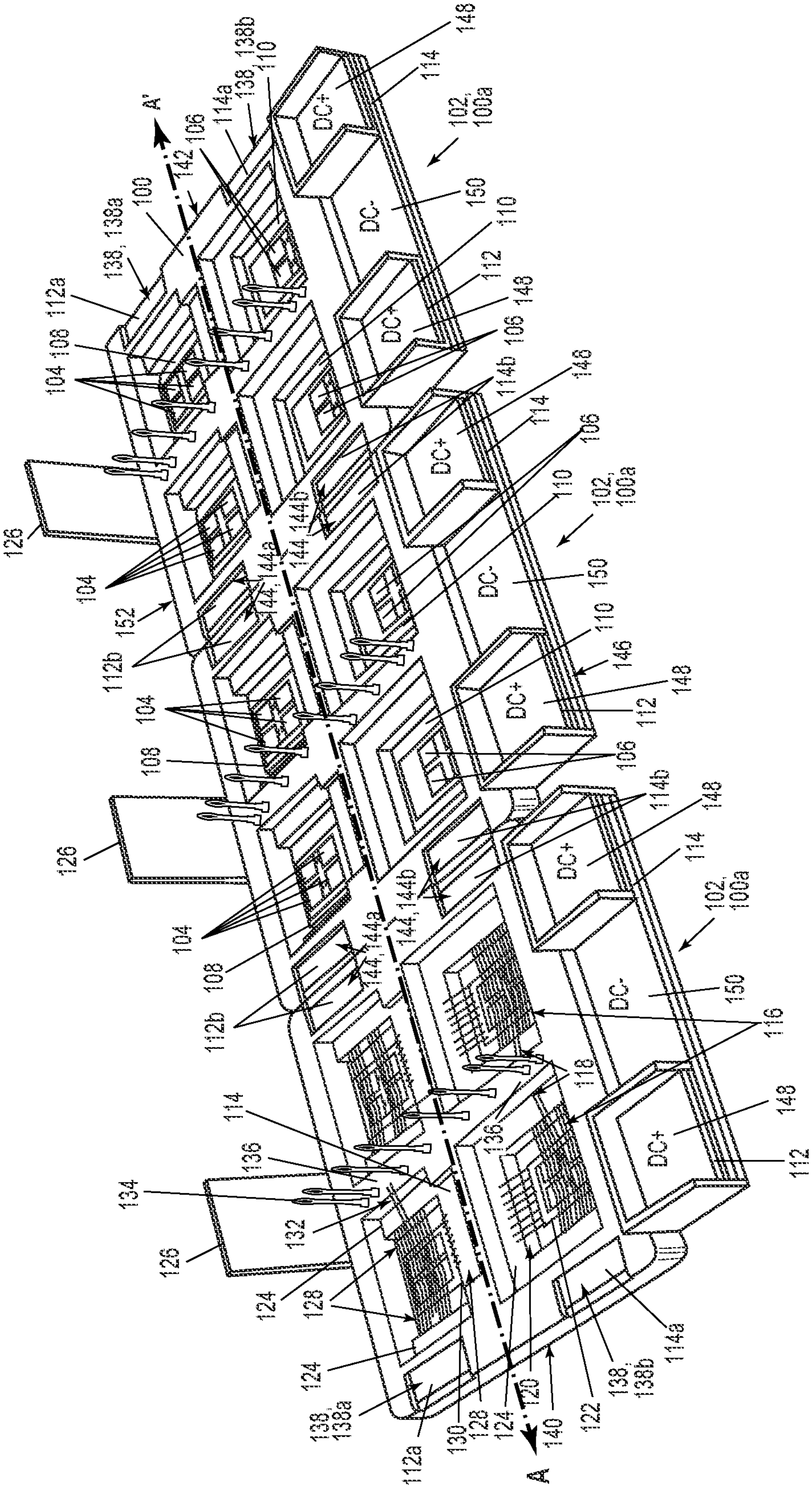
FIGS. 1A through 1C illustrate side perspective views of an embodiment of producing a power semiconductor module having one or more busbars for reducing stray inductance of the module.
Figure 1B:
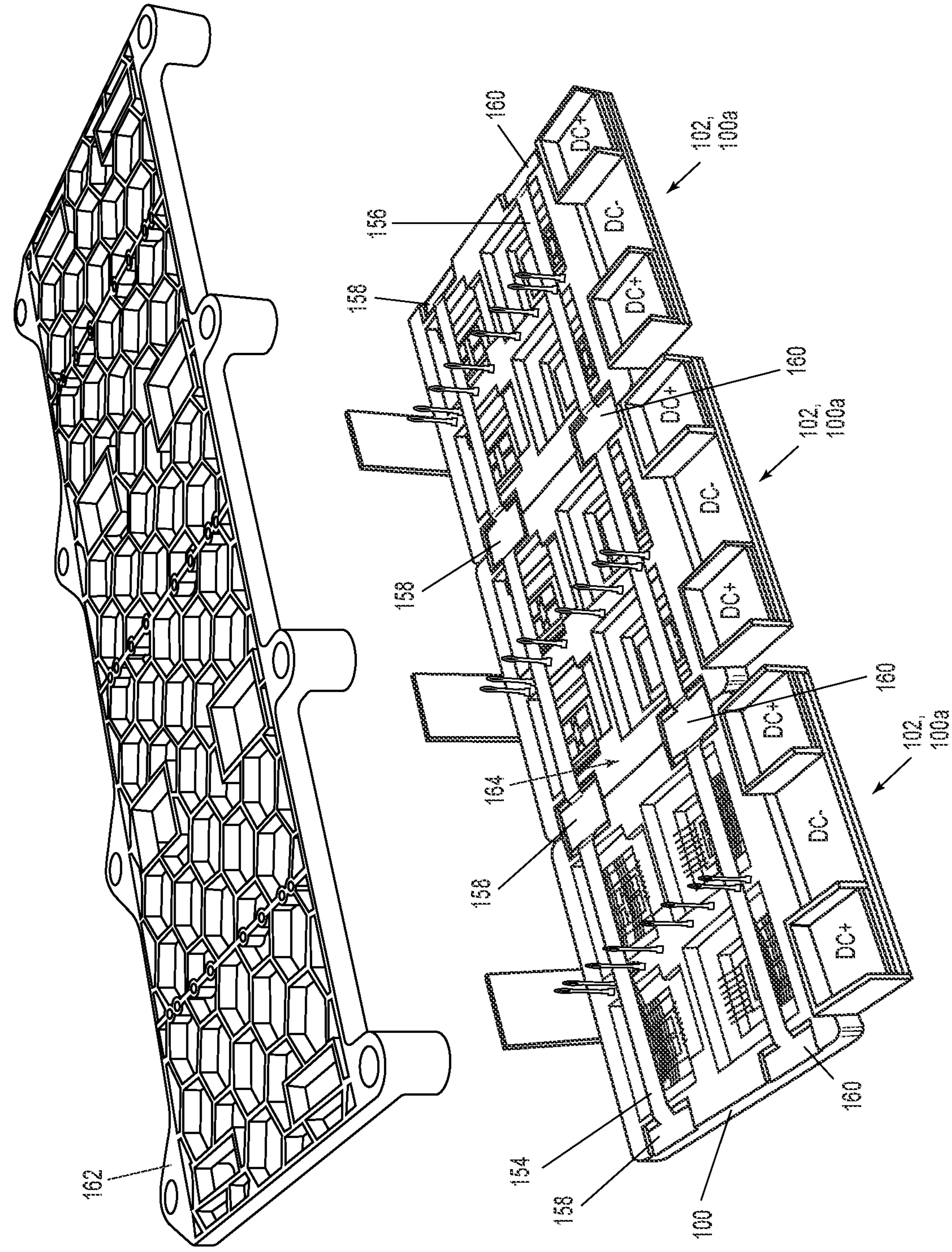
Figure 1C:
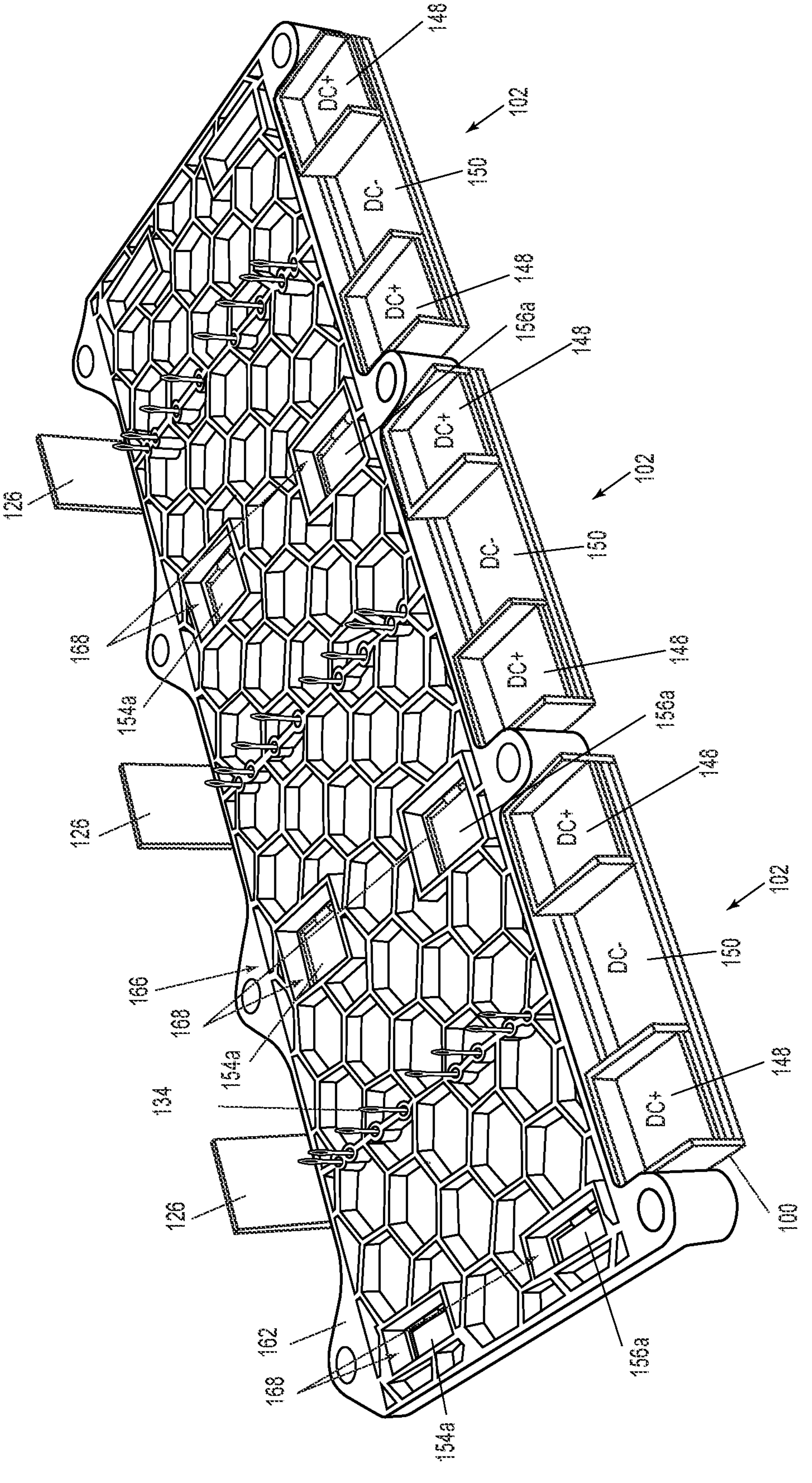

FIGS. 1A through 1C illustrate side perspective views of an embodiment of producing a power semiconductor module. The power semiconductor module may form part of a power electronics device for use in various power applications such as in a DC/AC inverter, a DC/DC converter, an AC/DC converter, a DC/AC converter, an AC/AC converter, a multi-phase inverter, an H-bridge, etc.

FIG. 1A shows an electrically insulative frame 100 such as a molded frame and a plurality of half bridge circuits 102 housed in the electrically insulative frame 100. Three (3) half bridge circuits 102 are shown in FIG. 1A, e.g., in the case of a 3-phase power converter. More generally, the power semiconductor module may include a single half bridge circuit 102 for a single-phase system or more than one half bridge circuit 102 for a multi-phase system. The electrically insulative frame 100 may be a single contiguous frame or comprise a separate frame subunit 100*a* for each half bridge circuit 102. In the case of separate frame subunits 100*a*, the frame subunits 100*a* are attached to one another, e.g., by plastic welding, gluing, etc.

Each half bridge circuit 102 includes one or more high-side power semiconductor dies 104 and one or more low-side power semiconductor dies 106. For example, a single RC-IGBT (reverse conducting insulated gate bipolar transistor) die or a single SiC MOSFET (metal-oxide-semiconductor field-effect transistor) die may be sufficient for the high-side die 104 and the low-side die 106 of each half bridge circuit 102. In the cases of multiple dies for the high-side and low-side of each half bridge circuit 102, the high-side power semiconductor dies 104 of each half bridge circuit 102 are electrically connected in parallel as are the low-side power semiconductor dies 106. The power semiconductor module is described next in the context of two or more high-side dies 104 and two or more low-side dies 106 per half bridge circuit 102. However, as explained above, each half bridge circuit 102 may instead have a single high-side die 104 and a single low-side die 106.

The high-side power semiconductor dies 104 of each half bridge circuit 102 may be attached to at least one first power electronics carrier 108 such as a DCB (direct copper bonded) substrate, an AMB (active metal brazed) substrate, an IMS (insulated metal substrate), etc. The low-side power semiconductor dies 106 of each half bridge circuit 102 likewise may be attached to at least one second power electronics carrier 110 such as a DCB substrate, an AMB substrate, an IMS, etc. The high-side and low-side power semiconductor dies 104, 106 may be power Si or SiC power MOSFET dies, HEMT (high-electron mobility transistor) dies, IGBT dies, JFET (junction filed-effect transistor) dies, etc. Additional types of semiconductor dies may be included in the power semiconductor module, such as power diode dies, logic dies, controller dies, gate driver dies, etc.

A first structured metal frame 112 embedded in the electrically insulative frame 100 is electrically connected to the drain or collector terminal of the high-side power semiconductor dies 104 of each half bridge circuit 102. In FIG. 1A, the high-side power semiconductor dies 104 and the low-side power semiconductor dies 106 are illustrated as vertical power transistor dies in that the primary current flow path is between the front and back sides of the dies 104, 106. The drain/collector terminal is typically disposed at the backside of a vertical power transistor die, with the gate and source/emitter terminals (and optionally one or more sense terminals) at the frontside of the die. Accordingly, the connections between the first structured metal frame 112 and the drain/collector terminal of the high-side power semiconductor dies 104 of each half bridge circuit 102 are out of view in FIG. 1A.

A second structured metal frame 114 embedded in the electrically insulative frame 100 is electrically connected to the source or emitter terminal of the low-side power semiconductor dies 106 of each half bridge circuit 102. The structured metal frames 112, 114 are electrically insulated from one another by the electrically insulative frame 100 and may comprise, e.g., respective Cu (copper) sheets or plates patterned by stamping, punching, etching, etc.

As shown for the leftmost half bridge circuit 102 in FIG. 1A, the connections between the second structured metal frame 114 and the source/emitter terminal of the low-side power semiconductor dies 106 of each half bridge circuit 102 may be implemented by bond wires 116 or other electrically conductive structures such as metal clips or branches of the second structured metal frame 114 that extend over the source/emitter terminal of the low-side power semiconductor dies 106. Additional bond wire connections 118 may be provided to the gate terminal of the low-side power semiconductor dies 106 of each half bridge circuit 102. Other bond wire connections 120 may electrically connect an upper metallization layer 122 of each low-side die carrier 110 and which is at drain/collector potential to a third structured metal frame 124 embedded in the electrically insulative frame 100. The third structured metal frame 124 has a terminal 126 that protrudes from the electrically insulative frame 100 to forms a phase/ac output 'PH' for each half bridge circuit 102. The source/emitter terminal of the high-side power semiconductor dies 104 of each half bridge circuit 102 are also electrically connected to the third structured metal frame 124, e.g., by bond wires 128, to complete the phase/ac output connection for each half bridge circuit 102.

Further as shown for the leftmost half bridge circuit 102 in FIG. 1A, the connections between the first structured metal frame 114 and the drain/collector terminal of the high-side power semiconductor dies 104 of each half bridge circuit 102 may be implemented by bond wires 128 or other electrically conductive structures such as metal clips or branches of the first structured metal frame 112 that connect to an upper metallization layer 130 of each high-side die carrier 108 and which is at drain/collector potential. Additional bond wire connections 132 may be provided to the gate terminal of the high-side power semiconductor dies 104 of each half bridge circuit 102. Pins 134 may be attached to the structured metal frames 112, 114 and other metal structures embedded in the electrically insulative frame 100, e.g., such as gate metal structures 136.

Openings 138 in the electrically insulative frame 100 of the power semiconductor module expose part 112*a* of the first structured metal frame 112 and/or part 114*a* of the second structured metal frame 114 at opposing first and second sidewalls 140, 142 of the electrically insulative frame 100. If the power semiconductor module includes more than one half bridge circuit 102, additional openings 144 in the electrically insulative frame 100 may expose part 112*b* of the first structured metal frame 112 and/or part 114*b* of the second structured metal frame 114 between adjacent ones of the half bridge circuits 102. The openings 138, 144 in the electrically insulative frame 100 enable busbar connections to the first structured metal frame 112 and/or the second structured metal frame 114, which helps to lower stray inductance of the power semiconductor module.

Along a longitudinal centerline A-A' of the power semiconductor module that runs between the opposing first and second sidewalls 140, 142 of the electrically insulative frame 100, the openings 138*a*, 144*a* in the electrically insulative frame 100 that expose part 112*a*, 112*b* of the first structured metal frame 112 may be disposed on an opposite side of the longitudinal centerline A-A' as the openings 138*b*, 144*b* that expose part 114*a*, 114*b* of the second structured metal frame 114.

Part of the first structured metal frame 112 may be exposed at a third side 146 of the electrically insulative frame 100 of the power semiconductor module to form at least one positive DC link terminal 148 for each half bridge circuit 102 at the third side 146. Part of the second structured metal frame 114 may be exposed at the third side 146 of the electrically insulative frame 100 to form at least one negative DC link terminal 150 for each half bridge circuit 102 at the third side 146.

The openings 138*b*, 144*b* in the electrically insulative frame 100 that expose part 114*a*, 114*b* of the second structured metal frame 114 may be disposed closer to the third side third side 146 of the electrically insulative frame 100 than to a fourth side 152 of the electrically insulative frame 100 opposite the third side 146. The openings 138*a*, 144*a* in the electrically insulative frame 100 that expose part 112*a*, 112*b* of the first structured metal frame 112 may be disposed closer to the fourth side 152 of the electrically insulative frame 100 than to the third side 146 of the electrically insulative frame 100.

FIG. 1B shows a first busbar 154 such as a Cu busbar attached to the part 112*a*, 112*b* of the first structured metal frame 112 exposed by the corresponding openings 138*a*, 144*a* in the electrically insulative frame 100 of the power semiconductor module. A second busbar 156 such as a Cu busbar may be attached to the part 114*a*, 114*b* of the second structured metal frame 114 exposed by the corresponding openings 138*b*, 144*b* in the electrically insulative frame 100 of the power semiconductor module. The power semiconductor module may include one or both busbars 154, 156.

In FIG. 1B, both busbars 154, 156 are provided and laterally spaced apart from one another. Further in FIG. 1B, the first busbar 154 is disposed above the openings 138*a*, 144*a* in the electrically insulative frame 100 that expose part 112*a*, 112*b* of the first structured metal frame 112 and the second busbar 156 is disposed above the openings 138*b*, 144*b* in the electrically insulative frame 100 that expose part 114*a*, 114*b* of the second structured metal frame 114.

The first busbar 154, if included in the power semiconductor module, may have tabs 158 received by the openings 138*a*, 144*a* in the electrically insulative frame 100 that expose part 112*a*, 112*b* of the first structured metal frame 112. The first busbar tabs 158 are attached, e.g., by soldering, welding, gluing, etc. to the part 112*a*, 112*b* of the first structured metal frame 112 exposed by the corresponding openings 138*a*, 144*a* in the electrically insulative frame 100.

The second busbar 156, if included in the power semiconductor module, may have tabs 160 received by the openings 138*b*, 144*b* in the electrically insulative frame 100 that expose part 114*a*, 114*b* of the second structured metal frame 114. The second busbar tabs 160 are attached, e.g., by soldering, welding, gluing, etc. to the part 114*a*, 114*b* of the second structured metal frame 114 exposed by the corresponding openings 138*b*, 144*b* in the electrically insulative frame 100.

FIG. 1B also shows at least one lid 162 such as a molded lid for the power semiconductor module, prior to attaching the lid 162 to the electrically insulative frame 100 of the power semiconductor module. The lid 162 is shown as a single lid in FIG. 1B but instead may be implemented as a separate lid for each half bridge circuit unit included in the power semiconductor module. The lid 162 is configured for attachment to the surface 164 of the electrically insulative frame 100 with the openings 138, 144 that expose part 112*a*, 112*b* of the first structured metal frame 112 and/or part 114*a*, 114*b* of the second structured metal frame 114. Each busbar 154, 156 included in the power semiconductor module is embedded in the lid 162, interposed between the lid 162 and the electrically insulative frame 100, or disposed above the lid 162.

FIG. 1C shows the lid 162 attached to the electrically insulative frame 100 to form the power semiconductor module. The lid 162 and the electrically insulative frame 100 may be attached to one another, e.g., by plastic welding, gluing, screw connection, etc. The lid 162 and the electrically insulative frame 100 form an enclosure for each half bridge circuit 102 included in the power semiconductor module.

FIG. 1C also shows the externally accessible terminals 126, 148, 150 and pins 134 of the power semiconductor module. As shown in FIG. 1C, the top side 166 of the lid 162 may have openings 168 that expose part 154*a*, 156*a* of each busbar 154, 156 included in the power semiconductor module. The power semiconductor module may form part of a power electronics device for use in various power applications such as in a DC/AC inverter, a DC/DC converter, an AC/DC converter, a DC/AC converter, an AC/AC converter, a multi-phase inverter, an H-bridge, etc.

Figure 2B:
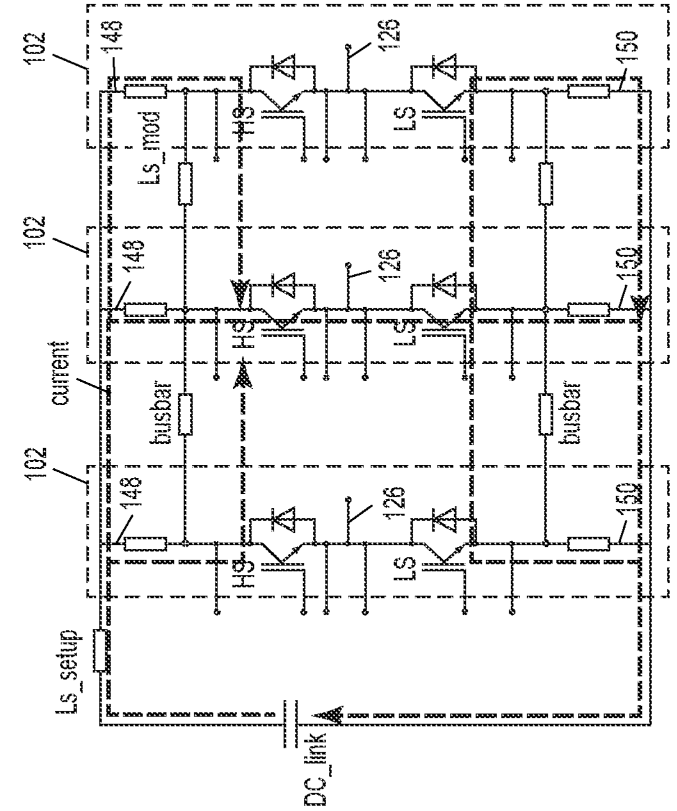
FIG. 2B illustrates the equivalent circuit of the power semiconductor module shown in FIGS. 1A through 1B with three half bridge circuits and the busbars.
Figure 2A:
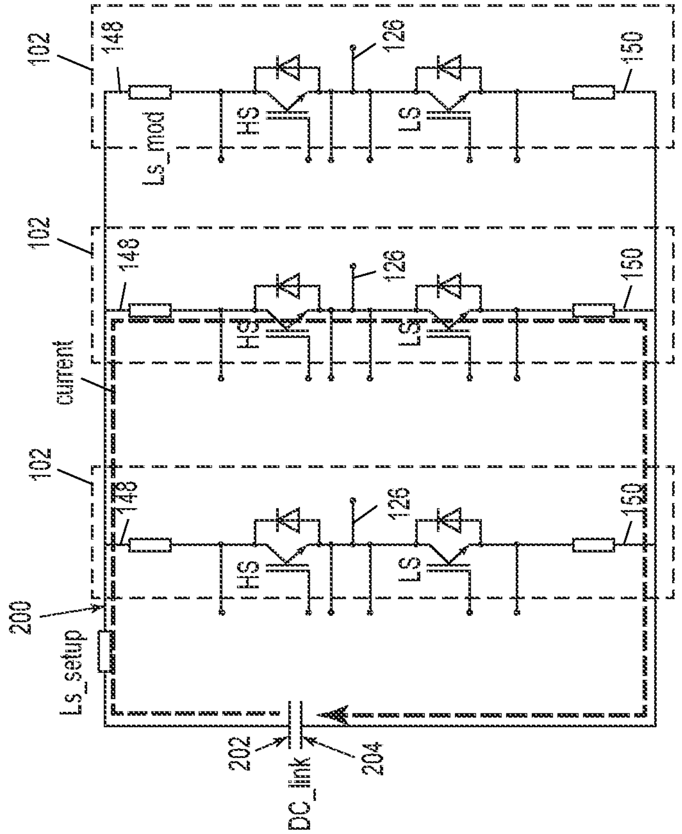
FIG. 2A illustrates the equivalent circuit of the power semiconductor module shown in FIGS. 1A through 1B with three half bridge circuits but without the busbars.

FIG. 2A illustrates the equivalent circuit of the power semiconductor module shown in FIGS. 1A through 1B with three (3) half bridge circuits 102 but without either busbar 154, 156. FIG. 2B illustrates the equivalent circuit of the power semiconductor module shown in FIGS. 1A through 1B with three (3) half bridge circuits 102 and both busbars 154, 156. Each half bridge high-side transistor 'HS' in FIGS. 2A and 2B corresponds to the high-side power semiconductor dies 104 of one half bridge circuit 102 in FIGS. 1A through 1C, each half bridge low-side transistor 'LS' in FIGS. 2A and 2B corresponds to the low-side power semiconductor dies 106 of the same half bridge circuit 102 in FIGS. 1A through 1C. The terminals phase and DC link terminals 126, 148. 150 of each half bridge circuit 102 are also shown in FIGS. 2A and 2B.

In the power converter device example illustrated in FIGS. 2A and 2B, a DC link capacitor DC_link has a first terminal 202 electrically connected to the drain/collector terminal of the high-side power semiconductor dies 104 of each half bridge circuit 102 via a DC link 200 and the positive DC link terminal 148 of each half bridge circuit 102. The DC link capacitor DC_link has a second terminal 204 electrically connected to the source/emitter terminal of the low-side power semiconductor dies 106 of each half bridge circuit 102 via the DC link 200 and the negative DC link terminal 150 of each half bridge circuit 102.

The DC link 200 has a stray inductance 'Ls_setup'. The stray inductance 'Ls_mod' associated with each individual half bridge circuit 102 also is shown in FIGS. 2A and 2B.

The busbars 154, 156 are omitted from the equivalent circuit in FIG. 2A. Current flows through an active half bridge circuit 102 over an individual connection, as indicated by the single current loop shown in FIG. 2A.

Both busbars 154, 156 are present in the equivalent circuit in FIG. 2B. The first busbar 154 electrically interconnects the drain/collector terminal of the high-side power semiconductor dies 104 of each half bridge circuit 102. The second busbar 156 electrically interconnects the source/emitter terminal of the low-side power semiconductor dies 106 of each half bridge circuit 102. For the same active half bridge circuit 102 as shown in FIG. 2A, current flows over the same individual connection but also a pulse current flows from the other half bridge circuits 102 through the respective busbars 154, 156, as indicated by the additional current loops shown in FIG. 2B.

The stray inductance 'busbar' associated with each busbar 154, 156 is in parallel with the stray inductance for the corresponding (high-side or low-side) part of the half bridge circuit 102. Accordingly, the stray inductance of each half bridge circuit 102 in FIG. 2B is reduced compared to only individually connecting each half bridge circuit as shown in FIG. 2A. If a layout restriction prevents the use of bot busbars 154, 156, the busbar 154/156 associated with the (high-side or low-side) path having the higher stary inductance may be included in the power semiconductor module and the other busbar 156/154 may be omitted. For example, the DC+ connection for each half bridge circuit 102 has two terminals 148 compared to a single terminal 150 for the DC− connection. In this case, and if layout restrictions warrant, the second busbar 156 may be included in the power semiconductor module and the first busbar 154 may be omitted.

Figure 3:
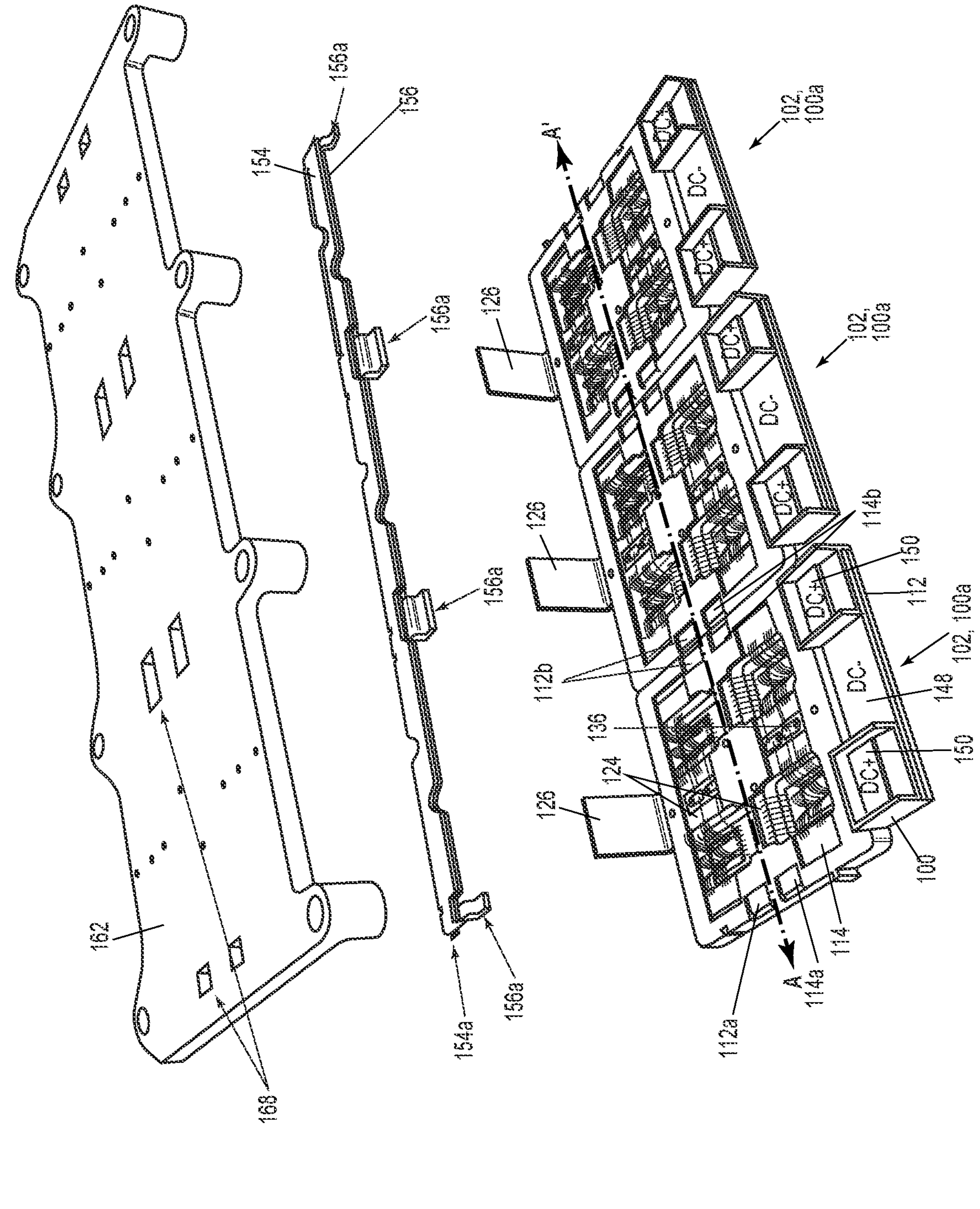
FIG. 3 illustrates an exploded view of the power semiconductor module, according to another embodiment.

FIG. 3 illustrates an exploded view of the power semiconductor module, according to another embodiment. In FIG. 3, the first busbar 154 and the second busbar 156 are vertically stacked one above the other and dielectrically insulated from one another. In the case of the busbars 154, 156 being embedded in the module lid 162, the busbars 154, 156 are dielectrically insulated from one another by part of the lid 162. In the case of the busbars 154, 156 being interposed between the lid 162 and the electrically insulative frame 100 or disposed above the lid 162, the busbars 154, 156 may be part of a laminate structure that dielectrically insulates the busbars 154, 156 from one another.

As shown in FIG. 3, the positive DC link connection 'P1' for each half bridge circuit 102 may have two terminals 148 compared to a single terminal 150 for the negative DC link connection 'N1'. In this case, and if layout restrictions warrant, the second busbar 156 may be included in the power semiconductor module and the first busbar 154 may be omitted. The power semiconductor module may instead have the DC link terminal configuration shown in FIGS. 1A through 1C, where the positive DC link connection 'P1' for each half bridge circuit 102 has a single terminal 148 and the negative DC link connection 'N1' has two terminals 150.

On a first side of the longitudinal centerline A-A' of the power semiconductor module in FIG. 3, the first busbar 154 may be attached to the part 112*a*, 112*b* of the first structured metal frame 112 exposed by the corresponding openings 138*a*, 144*a* in the electrically insulative frame 100. On the second (opposite) side of the longitudinal centerline A-A', the second busbar 156 may be attached to the part 114*a*, 114*b* of the second structured metal frame 114 exposed by the corresponding openings 138*b*, 144*b* in the electrically insulative frame 100. The electrically insulative frame 100 may be a single contiguous frame or comprise a separate frame subunit 100*a* for each half bridge circuit 102, as previously described herein.

FIGS. 4A through 4D illustrate respective top plan views of an embodiment of a method of producing the frame subunits 100*a* shown in FIGS. 1A through 1C and FIG. 3.

Figure 4A:
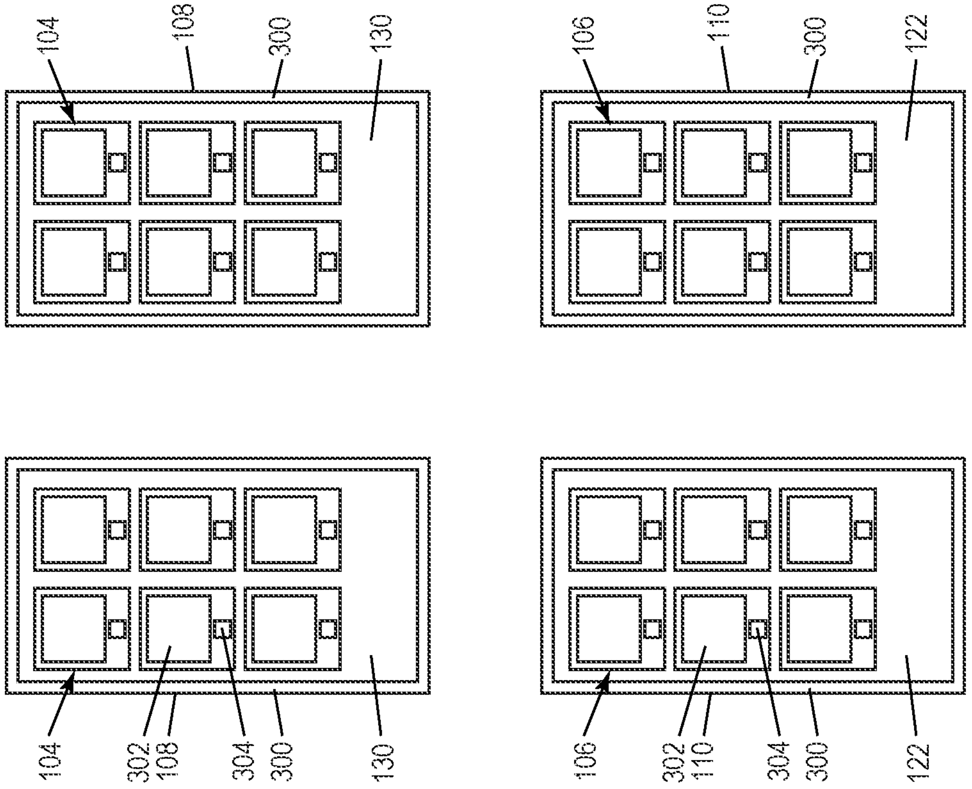
FIGS. 4A through 4D illustrate respective top plan views of an embodiment of a method of producing the frame subunits for the power semiconductor module shown in FIGS. 1A through 1C and FIG. 3.

FIG. 4A shows the each high-side die carrier 108 and each low-side die carrier 110 included in the frame subunit 100*a*. A plurality of high-side semiconductor dies 104 are attached to the upper metallization layer 130 of each high-side die carrier 108, and a plurality of low-side semiconductor dies 106 are attached to the upper metallization layer 122 of each low-side die carrier 110. The upper metallization layer 122, 130 of the die carriers 108, 110 may be a metallized side of a ceramic substrate 300. The lower side of each ceramic substrate 300 also may be metallized. A single high-side die carrier 108 instead may be provided for all high-side semiconductor dies 104 included in the frame subunit 100*a*, and a single low-side die carrier 110 instead may be provided for all low-side semiconductor dies 106 included in the frame subunit 100*a*.

In the case of vertical power transistors, the backside of each high-side semiconductor die 104 and of each low-side semiconductor die 106 includes a drain/collector terminal (out of view) attached to the upper metallization layer 122, 130 of the corresponding die carrier 108, 110. The frontside of each high-side semiconductor die 104 and of each low-side semiconductor die 106 includes at least a source/emitter terminal 302 and a gate terminal 304. For lateral power transistors, all die terminals would be at the frontside of the semiconductor dies 104, 106.

Figure 4B:
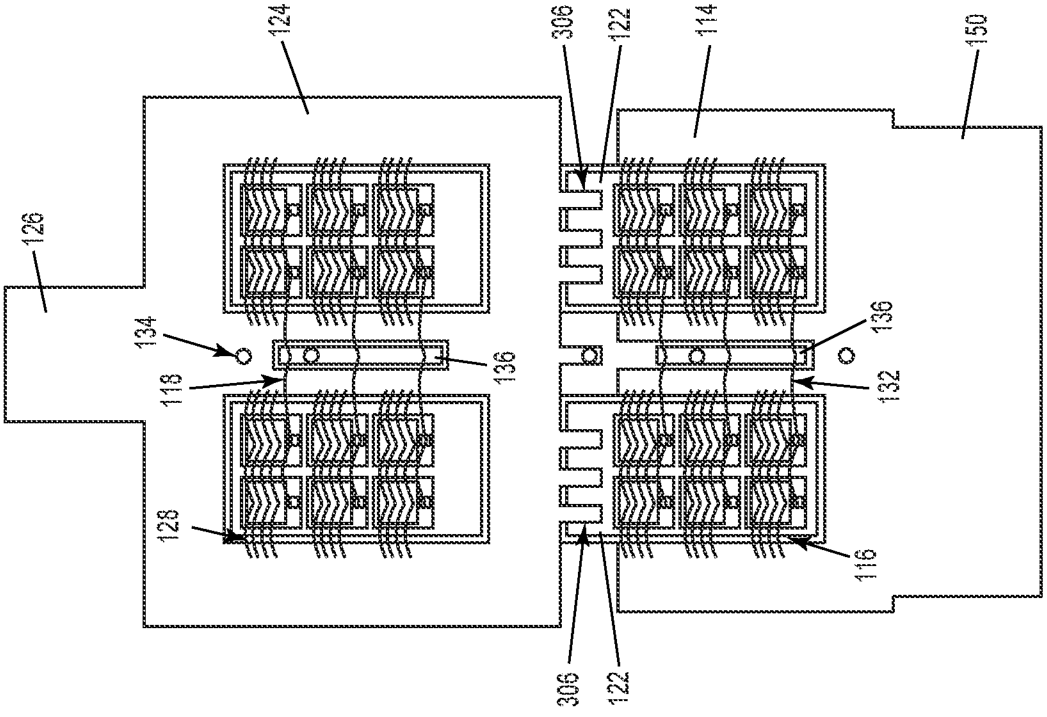

FIG. 4B shows the structured metal frames 114, 124 for the negative DC link connection and the output/phase connection, respectively, above the die carriers 106, 108. The second structured metal frame 114 includes at least one negative DC link terminal 150 for the half bridge circuit 102 included in the frame subunit 100*a*. The third structured metal frame 124 includes at least one phase/output terminal 126 for the half bridge circuit 102 included in the frame subunit 100*a*. FIG. 4B also shows the bond wire connections 128 between the source terminal 302 of the high-side semiconductor dies 104 and the third structured metal frame 124, and the bond wire connections 116 between the source terminal 302 of the low-side semiconductor dies 106 and the second structured metal frame 114. The gate metal structures 136 and corresponding gate bond wire connections 132 also may be provided during this part of the frame subunit production. FIG. 4B also shows tabs 306 of the third structured metal frame 124 attached to the upper metallization 122 of the low-side die carriers 108, to complete the phase/output connection for the half bridge circuit 102 included in the frame subunit 100*a*.

Figure 4C:
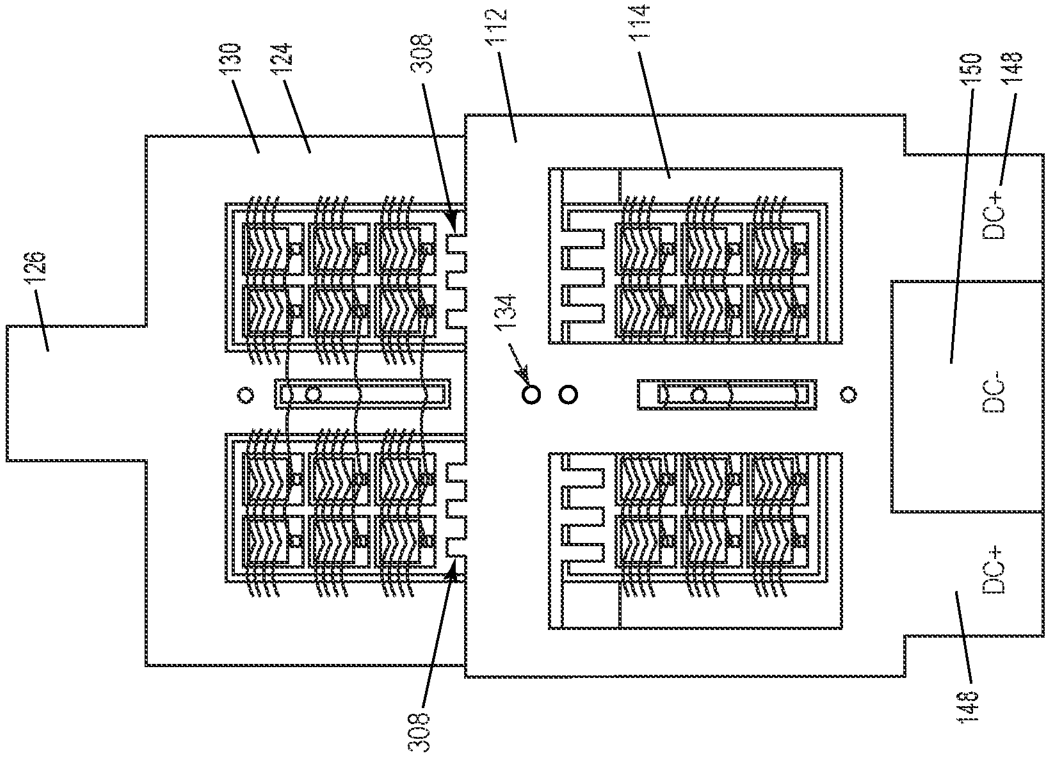

FIG. 4C shows the structured metal frame 112 for the positive DC link connection above the structured metal frames 114, 124 for the negative DC link connection and the output/phase connection, respectively. The first structured metal frame 112 includes at least one positive DC link terminal 148 for the half bridge circuit 102 included in the frame subunit 100*a*. The first structured metal frame 112 also has tabs 308 attached to the upper metallization 130 of the high-side die carriers 108, to provide the positive DC link connection to the drain/collector terminal of the high-side semiconductor dies 104.

Figure 4D:
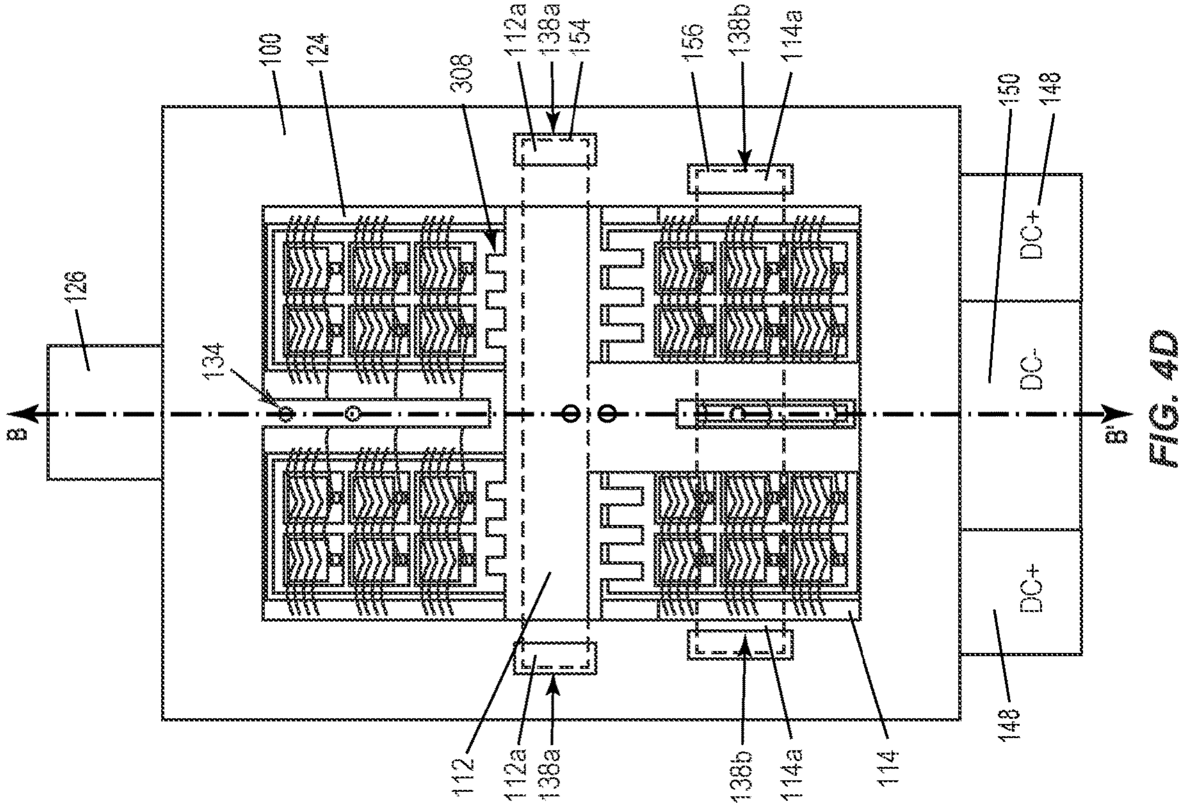

FIG. 4D shows the electrically insulative frame 100 that houses the half bridge circuit of the frame subunit 100*a*. The electrically insulative frame 100 may be formed by a molding process, for example. The electrically insulative frame 100 includes openings 138*a* that expose part 112*a* of the first structured metal frame 112 and openings 138*b* that expose part 114*a* of the second structured metal frame 114. A first busbar 154 such as a Cu busbar may be attached to the part 112*a* of the first structured metal frame 112 exposed by the corresponding openings 138*a* in the electrically insulative frame 100 and/or a second busbar 156 such as a Cu busbar may be attached to the part 114*a* of the second structured metal frame 114 exposed by the corresponding openings 138*b* in the electrically insulative frame 100. The busbars 154, 156 are illustrated as dashed rectangles in FIG. 4B to indicate that one or both busbars 154, 156 may be embedded in the lid for the frame subunit 100*a*, interposed between the lid and the electrically insulative frame 100, or disposed above the lid. The lid for the frame subunit 100*a* is not shown in FIG. 4D to provide an unobstructed view of the frame subunit components. The lid for the frame subunit 100*a* may have the same design as the lid 162 shown in FIGS. 1A through 1C or in FIG. 3 or may have a different design.

Figure 5:
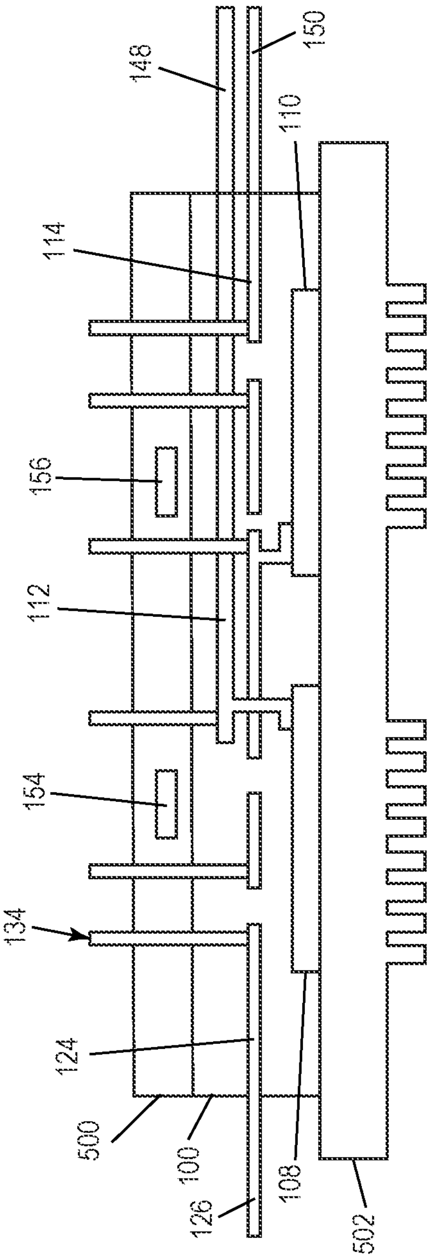
FIG. 5 illustrates a cross-sectional view of the frame subunit produced by the method illustrated in FIGS. 4A through 4D, along the line labelled B-B in FIG. 4D.

FIG. 5 illustrates a cross-sectional view of the frame subunit 100*a* produced by the method illustrated in FIGS. 4A through 4D, along the line labelled B-B in FIG. 4D. A lid 500 is attached to the surface of the electrically insulative frame 100 with the openings 138*a*, 138*b* that expose part 112*a*, 114*a* of the first and second structured metal frames 112, 114, respectively. The lid 500 and the electrically insulative frame 100 form an enclosure for the half bridge circuit 102 included in the frame subunit 100*a*. The busbars 154, 156 are illustrated in FIG. 5 as being embedded in the lid 500. The busbars 154, 156 instead may interposed between the lid 500 and the electrically insulative frame 100 or disposed above the lid 500. A heatsink 502 may be attached to the backside of the electrically insulative frame 100 at which the die carriers 108, 110 may be exposed for improved heat dissipation.

The frame subunits 100*a* shown in FIGS. 1A though 1C, FIG. 3 and FIG. 5 could be used as stand-alone power semiconductor modules. In another embodiment, two or more of the frame subunits 100*a* could form a power semiconductor module, e.g., as shown in FIGS. 1A though 1C and FIG. 2.

Figure 6:
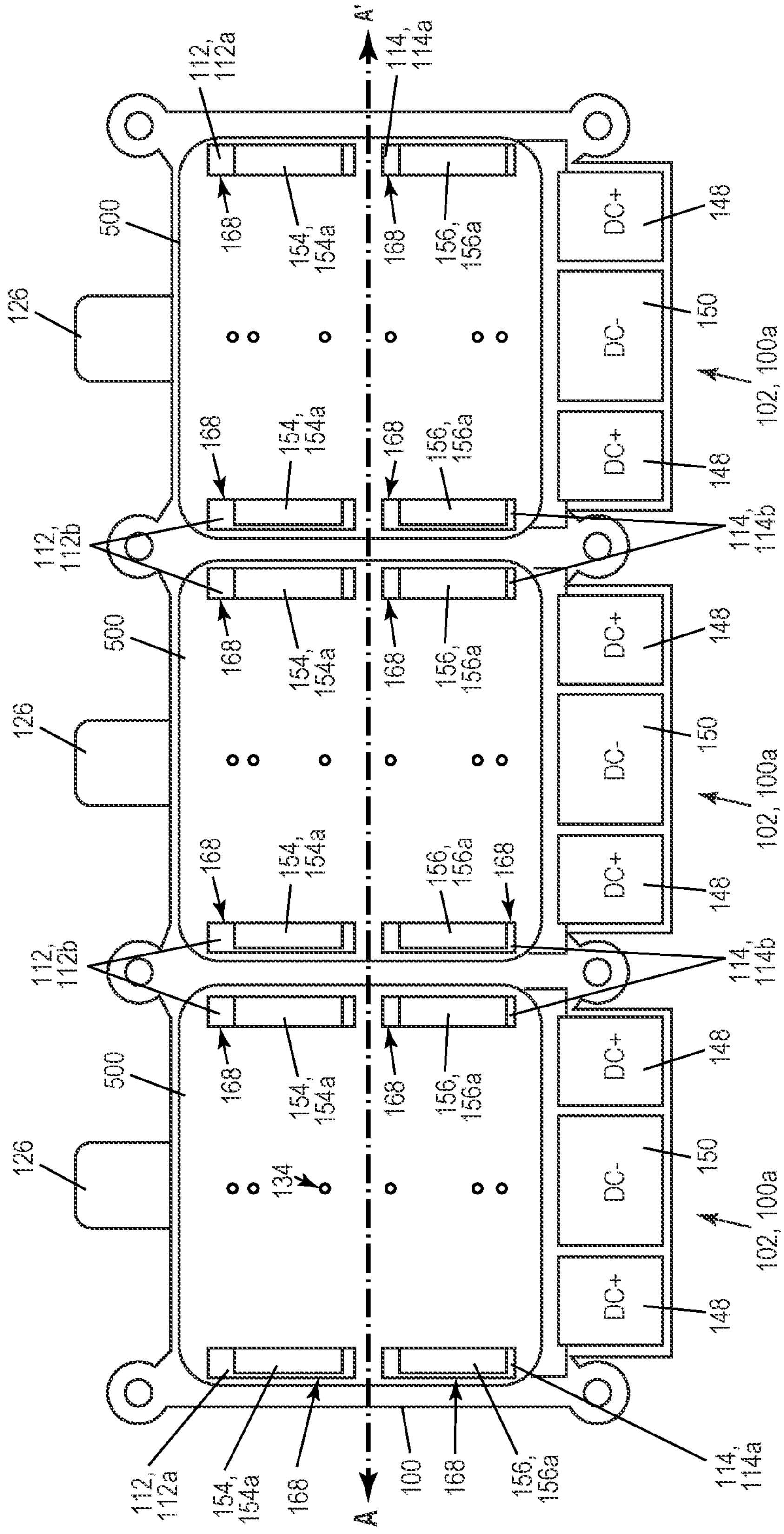
FIG. 6 illustrates a top plan view of an embodiment of a power semiconductor module that includes three of the frame subunits shown in FIG. 5.

FIG. 6 illustrates a top plan view of an embodiment of a power semiconductor module that includes three of the frame subunits 100*a* shown in FIG. 5. The frame subunits 100*a* may be attached to one another, e.g., by plastic welding, gluing, etc. Each frame subunit 100*a* has a separate lid 500 in FIG. 6. Each lid 500 may have openings 168 that expose part 154*a*, 156*a* of each busbar 154, 156 included in the power semiconductor module. FIG. 6 also shows each busbar 154, 156 included in the power semiconductor module being embedded in the lid 500 or interposed between the lid 500 and the electrically insulative frame 100 of each frame subunit 100*a*.

Figure 7:
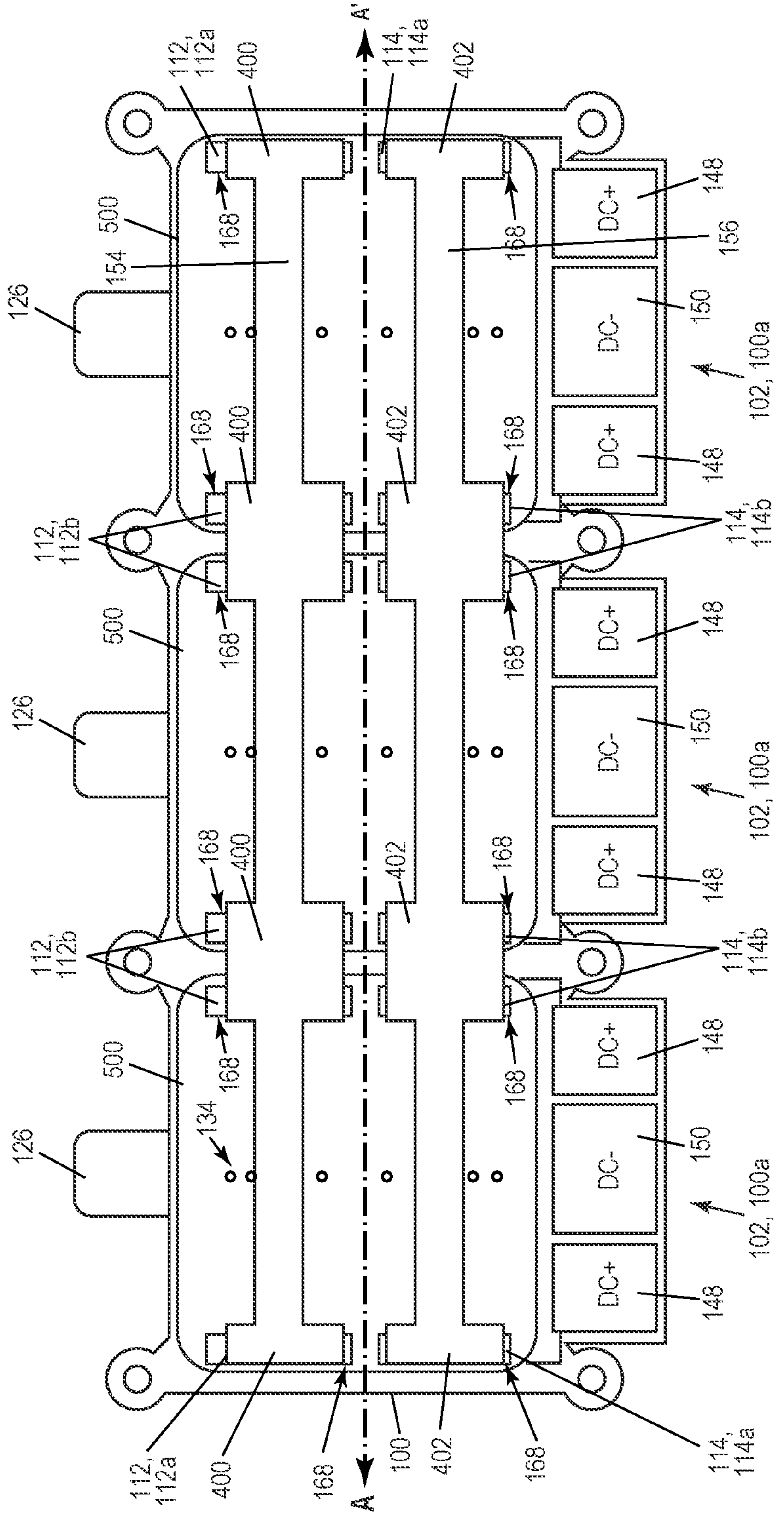
FIG. 7 illustrates a top plan view of another embodiment of a power semiconductor module that includes three of the frame subunits shown in FIG. 5.

FIG. 7 illustrates a top plan view of another embodiment of a power semiconductor module that includes three of the frame subunits 100*a* shown in FIG. 5. The embodiment shown in FIG. 7 is similar to the embodiment shown in FIG. 6. In FIG. 7, each busbar 154, 156 included in the power semiconductor module is disposed above the lid 500 of each frame subunit 100*a* and has tabs 400, 402 attached to the part 112*a*, 112*b* of the corresponding structured metal frame 112, 114 exposed by the respective openings 168 in the lid 500 of each frame subunit 100*a*. The same busbar 154, 156 may span all frame subunits 100*a* included in the power semiconductor module.

Figure 8:
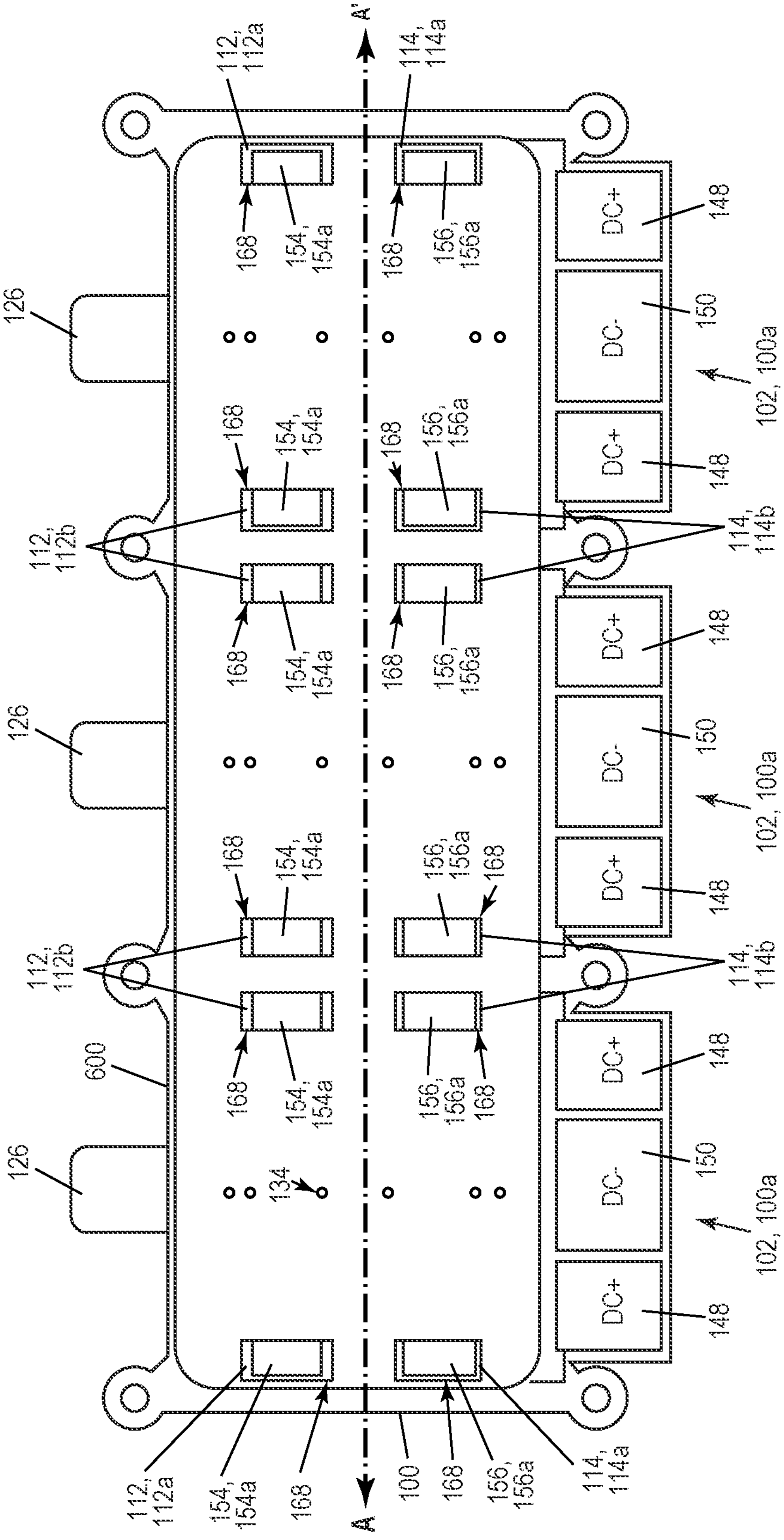
FIG. 8 illustrates a top plan view of another embodiment of a power semiconductor module that includes three of the frame subunits shown in FIG. 5.

FIG. 8 illustrates a top plan view of another embodiment of a power semiconductor module that includes three of the frame subunits 100*a* shown in FIG. 5. The embodiment shown in FIG. 8 is similar to the embodiment shown in FIG. 6. In FIG. 8, a single lid 600 is attached to the electrically insulative frame 100 of all frame subunits 100*a* included in the power semiconductor module. The same busbar 154, 156 may span all frame subunits 100*a* included in the power semiconductor module. The busbars 154, 156 instead may be disposed above the lid 600, e.g., as shown in FIG. 7.

Figure 9:
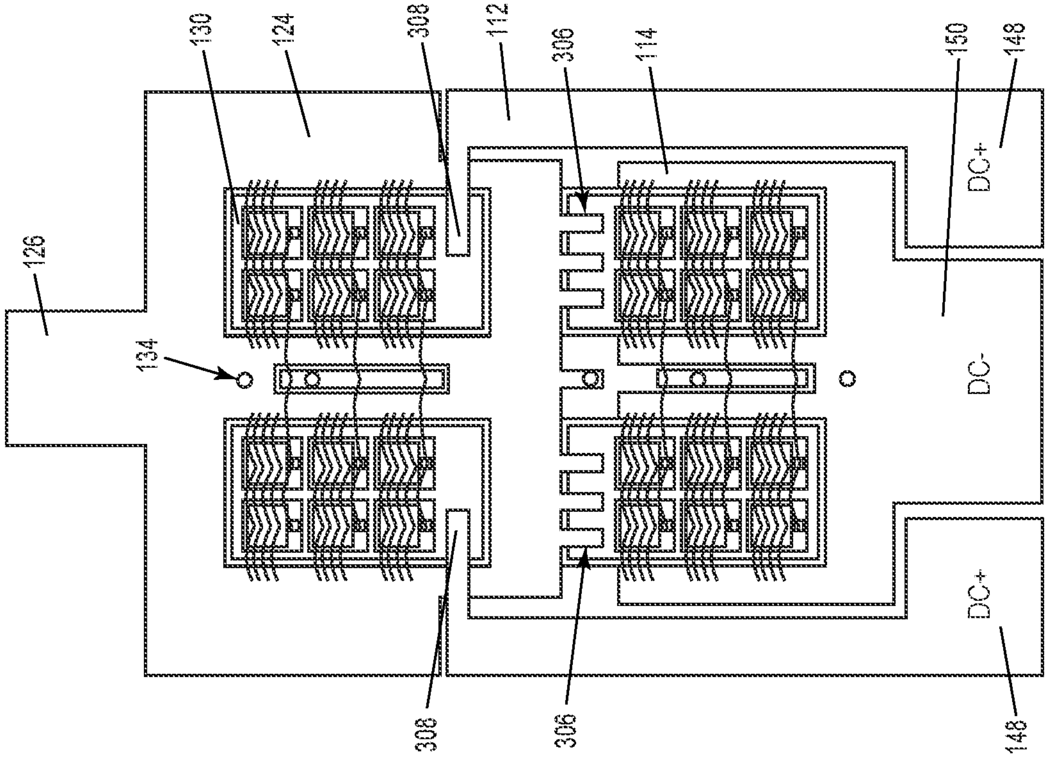
FIG. 9 illustrates a top plan view of the frame subunits shown in FIGS. 1A through 1C and FIG. 3, according to another embodiment.

FIG. 9 illustrates a top plan view of the frame subunits 100*a* shown in FIGS. 1A through 1C and FIG. 3, according to another embodiment. In FIG. 9, the first structured metal frame 112 and the second structured metal frame 114 are arranged side-by-side as a single structured part, e.g., formed by stamping of sheet metal. The laterally spaced structured metal frames 112, 114 in FIG. 9 have higher stray inductance but are less complex to manufacture compared to the vertically stacked embodiment, while still providing additional DC+ and DC− access points.

Although the present disclosure is not so limited, the following numbered examples demonstrate one or more aspects of the disclosure.

Example 1. A power semiconductor module, comprising: an electrically insulative frame; a plurality of half bridge circuits housed in the electrically insulative frame, each half bridge circuit comprising one or more high-side power semiconductor dies and one or more low-side power semiconductor dies; a first structured metal frame embedded in the electrically insulative frame and electrically connected to a drain or collector terminal of the one or more high-side power semiconductor dies of each half bridge circuit; a second structured metal frame embedded in the electrically insulative frame and electrically connected to a source or emitter terminal of the one or more low-side power semiconductor dies of each half bridge circuit; and a plurality of first openings in the electrically insulative frame that expose part of the first structured metal frame or part of the second structured metal frame at opposing first and second sidewalls of the electrically insulative frame and between adjacent ones of the half bridge circuits.

Example 2. The power semiconductor module of example 1, wherein the plurality of first openings in the electrically insulative frame expose part of the first structured metal frame at the opposing first and second sidewalls of the electrically insulative frame and between adjacent ones of the half bridge circuits.

Example 3. The power semiconductor module of example 2, further comprising: a plurality of second openings in the electrically insulative frame that expose part of the second structured metal frame at the opposing first and second sidewalls of the electrically insulative frame and between adjacent ones of the half bridge circuits.

Example 4. The power semiconductor module of example 3, wherein along a longitudinal centerline that runs between the opposing first and second sidewalls of the electrically insulative frame, the plurality of first openings is disposed on an opposite side of the longitudinal centerline as the plurality of second openings.

Example 5. The power semiconductor module of example 3 or 4, wherein part of the first structured metal frame is exposed at a third side of the electrically insulative frame to form at least one positive DC link terminal for each half bridge circuit at the third side, wherein part of the second structured metal frame is exposed at the third side of the electrically insulative frame to form at least one negative DC link terminal for each half bridge circuit at the third side, wherein the plurality of second openings is disposed closer to the third side than to a fourth side of the electrically insulative frame opposite the third side, and wherein the plurality of first openings is disposed closer to the fourth side than to the third side of the electrically insulative frame.

Example 6. The power semiconductor module of example 1, wherein part of the first structured metal frame is exposed at a third side of the electrically insulative frame to form at least one positive DC link terminal for each half bridge circuit at the third side, wherein part of the second structured metal frame is exposed at the third side of the electrically insulative frame to form at least one negative DC link terminal for each half bridge circuit at the third side, wherein the plurality of first openings in the electrically insulative frame expose part of the first structured metal frame at the opposing first and second sidewalls of the electrically insulative frame and between adjacent ones of the half bridge circuits, and wherein the plurality of first openings is disposed closer to a fourth side of the electrically insulative frame opposite the third side than to the third side.

Example 7. The power semiconductor module of any of examples 1 through 6, further comprising: a first busbar attached to the part of the first structured metal frame or the part of the second structured metal frame exposed by the plurality of first openings in the electrically insulative frame.

Example 8. The power semiconductor module of example 7, wherein the first busbar comprises a plurality of tabs received by the plurality of first openings in the electrically insulative frame and attached to the part of the first structured metal frame or the part of the second structured metal frame exposed by the plurality of first openings in the electrically insulative frame.

Example 9. The power semiconductor module of example 7 or 8, further comprising: at least one lid attached to a surface of the electrically insulative frame with the plurality of first openings, wherein the at least one lid and the electrically insulative frame form an enclosure for the plurality of half bridge circuits, wherein the first busbar is embedded in the at least one lid, interposed between the at least one lid and the electrically insulative frame, or disposed above the at least one lid.

Example 10. The power semiconductor module of any of examples 7 through 9, wherein the plurality of first openings in the electrically insulative frame expose part of the first structured metal frame at the opposing first and second sidewalls of the electrically insulative frame and between adjacent ones of the half bridges, and wherein the first busbar electrically interconnects the drain or collector terminal of the one or more high-side power semiconductor dies of each half bridge circuit.

Example 11. The power semiconductor module of example 10, further comprising: a plurality of second openings in the electrically insulative frame that expose part of the second structured metal frame at the opposing first and second sidewalls of the electrically insulative frame and between adjacent ones of the half bridges; and a second busbar attached to the part of the second structured metal frame exposed by the plurality of second openings in the electrically insulative frame, wherein the second busbar electrically interconnects the source or emitter terminal of the one or more low-side power semiconductor dies of each half bridge circuit.

Example 12. The power semiconductor module of example 11, wherein the first busbar comprises a plurality of tabs received by the plurality of first openings in the electrically insulative frame and attached to the part of the first structured metal frame exposed by the plurality of first openings in the electrically insulative frame, and wherein the second busbar comprises a plurality of tabs received by the plurality of second openings in the electrically insulative frame and attached to the part of the second structured metal frame exposed by the plurality of second openings in the electrically insulative frame.

Example 13. The power semiconductor module of example 11 or 12, further comprising: at least one lid attached to a surface of the electrically insulative frame with the plurality of first openings and the plurality of second openings, wherein the at least one lid and the electrically insulative frame form an enclosure for the plurality of half bridge circuits, wherein the first busbar and the second busbar are embedded in the at least one lid, interposed between the at least one lid and the electrically insulative frame, or disposed above the at least one lid.

Example 14. The power semiconductor module of example 13, wherein the first busbar and the second busbar are laterally spaced apart from one another.

Example 15. The power semiconductor module of example 14, wherein the plurality of first openings in the electrically insulative frame is disposed on a first side of a longitudinal centerline that runs between the opposing first and second sidewalls of the electrically insulative frame, wherein the plurality of second openings in the electrically insulative frame is disposed on a second side of the longitudinal centerline opposite the first side, wherein the first busbar is disposed above the plurality of first openings in the electrically insulative frame, and wherein the second busbar is disposed above the plurality of second openings in the electrically insulative frame.

Example 16. The power semiconductor module of example 13, wherein the first busbar and the second busbar are vertically stacked one above the other and dielectrically insulated from one another.

Example 17. The power semiconductor module of example 16, wherein the plurality of first openings in the electrically insulative frame is disposed on a first side of a longitudinal centerline that runs between the opposing first and second sidewalls of the electrically insulative frame, wherein the plurality of second openings in the electrically insulative frame is disposed on a second side of the longitudinal centerline opposite the first side, wherein on the first side of the longitudinal centerline, the first busbar is attached to the part of the first structured metal frame exposed by the plurality of first openings in the electrically insulative frame, and wherein on the second side of the longitudinal centerline, the second busbar is attached to the part of the second structured metal frame exposed by the plurality of second openings in the electrically insulative frame.

Example 18. The power semiconductor module of any of examples 1 through 17, wherein the electrically insulative frame comprises a separate frame subunit for each half bridge circuit, and wherein the frame subunits are attached to one another.

Example 19. The power semiconductor module of any of examples 1 through 18, wherein the first structured metal frame and the second structured metal frame are arranged side-by-side as a single structured part.

Example 20. A power semiconductor module, comprising: an electrically insulative frame; a half bridge circuit housed in the electrically insulative frame and comprising one or more high-side power semiconductor dies and one or more low-side power semiconductor dies; a first structured metal frame embedded in the electrically insulative frame and electrically connected to a drain or collector terminal of the one or more high-side power semiconductor dies; a second structured metal frame embedded in the electrically insulative frame and electrically connected to a source or emitter terminal of the one or more low-side power semiconductor dies; and a plurality of first openings in the electrically insulative frame that expose part of the first structured metal frame or part of the second structured metal frame at opposing first and second sidewalls of the electrically insulative frame.

Example 21. The power semiconductor module of example 20, further comprising: a first busbar attached to the part of the first structured metal frame or the part of the second structured metal frame exposed by the plurality of first openings in the electrically insulative frame.

Example 22. The power semiconductor module of example 21, further comprising: a lid attached to a surface of the electrically insulative frame with the plurality of first openings, wherein the lid and the electrically insulative frame form an enclosure for the half bridge circuit, wherein the first busbar is embedded in the lid, interposed between the lid and the electrically insulative frame, or disposed above the lid.

Example 23. The power semiconductor module of example 21 or 22, wherein the plurality of first openings in the electrically insulative frame expose part of the first structured metal frame at the opposing first and second sidewalls of the electrically insulative frame, and wherein the first busbar electrically interconnects the drain or collector terminal of the one or more high-side power semiconductor dies.

Example 24. The power semiconductor module of example 23, further comprising: a plurality of second openings in the electrically insulative frame that expose part of the second structured metal frame at the opposing first and second sidewalls of the electrically insulative frame; and a second busbar attached to the part of the second structured metal frame exposed by the plurality of second openings in the electrically insulative frame, wherein the second busbar electrically interconnects the source or emitter terminal of the one or more low-side power semiconductor dies.

Example 25. The power semiconductor module of example 24, further comprising: a lid attached to a surface of the electrically insulative frame with the plurality of first openings and the plurality of second openings, wherein the lid and the electrically insulative frame form an enclosure for the plurality of half bridge circuits, wherein the first busbar and the second busbar are embedded in the lid, interposed between the lid and the electrically insulative frame, or disposed above the lid.

Example 26. A power electronics device, comprising: a power semiconductor module comprising: an electrically insulative frame; a plurality of half bridge circuits housed in the electrically insulative frame and each comprising one or more high-side power semiconductor dies and one or more low-side power semiconductor dies; a first structured metal frame embedded in the electrically insulative frame and electrically connected to a drain or collector terminal of the one or more high-side power semiconductor dies of each half bridge circuit; a second structured metal frame embedded in the electrically insulative frame and electrically connected to a source or emitter terminal of the one or more low-side power semiconductor dies of each half bridge circuit; a plurality of first openings in the electrically insulative frame that expose part of the first structured metal frame or part of the second structured metal frame at opposing first and second sidewalls of the electrically insulative frame and between adjacent ones of the half bridge circuits; a first busbar attached to the part of the first structured metal frame or the part of the second structured metal frame exposed by the plurality of first openings in the electrically insulative frame; and at least one lid attached to a surface of the electrically insulative frame with the plurality of first openings, wherein the at least one lid and the electrically insulative frame form an enclosure for the plurality of half bridge circuits, wherein the first busbar is embedded in the at least one lid, interposed between the at least one lid and the electrically insulative frame, or disposed above the at least one lid; and a DC link capacitor having a first terminal electrically connected to the drain or collector terminal of the one or more high-side power semiconductor dies of each half bridge circuit and a second terminal electrically connected to the source or emitter terminal of the one or more low-side power semiconductor dies of each half bridge circuit.

Example 27. The power electronics device of example 26, wherein the plurality of first openings in the electrically insulative frame expose part of the first structured metal frame at the opposing first and second sidewalls of the electrically insulative frame and between adjacent ones of the half bridge circuits, and wherein the first busbar electrically interconnects the drain or collector terminal of the one or more high-side power semiconductor dies of each half bridge circuit.

Example 28. The power electronics device of example 27, further comprising: a plurality of second openings in the electrically insulative frame that expose part of the second structured metal frame at the opposing first and second sidewalls of the electrically insulative frame and between adjacent ones of the half bridge circuits; and a second busbar attached to the part of the second structured metal frame exposed by the plurality of second openings in the electrically insulative frame, wherein the second busbar electrically interconnects the source or emitter terminal of the one or more low-side power semiconductor dies of each half bridge circuit.

Terms such as "first", "second", and the like, are used to describe various elements, regions, sections, etc. and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

It is to be understood that the features of the various embodiments described herein may be combined with each other, unless specifically noted otherwise.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A power semiconductor module, comprising:

an electrically insulative frame;

a plurality of half bridge circuits housed in the electrically insulative frame, each half bridge circuit comprising one or more high-side power semiconductor dies and one or more low-side power semiconductor dies;

a first structured metal frame embedded in the electrically insulative frame and electrically connected to a drain or collector terminal of the one or more high-side power semiconductor dies of each half bridge circuit;

a second structured metal frame embedded in the electrically insulative frame and electrically connected to a source or emitter terminal of the one or more low-side power semiconductor dies of each half bridge circuit; and a plurality of first openings in the electrically insulative frame that expose part of the first structured metal frame or part of the second structured metal frame at opposing first and second sidewalls of the electrically insulative frame and between adjacent ones of the half bridge circuits.

2. The power semiconductor module of claim 1, wherein the plurality of first openings in the electrically insulative frame expose part of the first structured metal frame at the opposing first and second sidewalls of the electrically insulative frame and between adjacent ones of the half bridge circuits.

3. The power semiconductor module of claim 2, further comprising:

a plurality of second openings in the electrically insulative frame that expose part of the second structured metal frame at the opposing first and second sidewalls of the electrically insulative frame and between adjacent ones of the half bridge circuits.

4. The power semiconductor module of claim 3, wherein along a longitudinal centerline that runs between the opposing first and second sidewalls of the electrically insulative frame, the plurality of first openings is disposed on an opposite side of the longitudinal centerline as the plurality of second openings.

5. The power semiconductor module of claim 3, wherein part of the first structured metal frame is exposed at a third side of the electrically insulative frame to form at least one positive DC link terminal for each half bridge circuit at the third side, wherein part of the second structured metal frame is exposed at the third side of the electrically insulative frame to form at least one negative DC link terminal for each half bridge circuit at the third side, wherein the plurality of second openings is disposed closer to the third side than to a fourth side of the electrically insulative frame opposite the third side, and wherein the plurality of first openings is disposed closer to the fourth side than to the third side of the electrically insulative frame.

6. The power semiconductor module of claim 1, wherein part of the first structured metal frame is exposed at a third side of the electrically insulative frame to form at least one positive DC link terminal for each half bridge circuit at the third side, wherein part of the second structured metal frame is exposed at the third side of the electrically insulative frame to form at least one negative DC link terminal for each half bridge circuit at the third side, wherein the plurality of first openings in the electrically insulative frame expose part of the first structured metal frame at the opposing first and second sidewalls of the electrically insulative frame and between adjacent ones of the half bridge circuits, and wherein the plurality of first openings is disposed closer to a fourth side of the electrically insulative frame opposite the third side than to the third side.

7. The power semiconductor module of claim 1, further comprising:

a first busbar attached to the part of the first structured metal frame or the part of the second structured metal frame exposed by the plurality of first openings in the electrically insulative frame.

8. The power semiconductor module of claim 7, wherein the first busbar comprises a plurality of tabs received by the plurality of first openings in the electrically insulative frame and attached to the part of the first structured metal frame or the part of the second structured metal frame exposed by the plurality of first openings in the electrically insulative frame.

9. The power semiconductor module of claim 7, further comprising:

at least one lid attached to a surface of the electrically insulative frame with the plurality of first openings, wherein the at least one lid and the electrically insulative frame form an enclosure for the plurality of half bridge circuits, wherein the first busbar is embedded in the at least one lid, interposed between the at least one lid and the electrically insulative frame, or disposed above the at least one lid.

10. The power semiconductor module of claim 7, wherein the plurality of first openings in the electrically insulative frame expose part of the first structured metal frame at the opposing first and second sidewalls of the electrically insulative frame and between adjacent ones of the half bridges, and wherein the first busbar electrically interconnects the drain or collector terminal of the one or more high-side power semiconductor dies of each half bridge circuit.

11. The power semiconductor module of claim 10, further comprising:

a plurality of second openings in the electrically insulative frame that expose part of the second structured metal frame at the opposing first and second sidewalls of the electrically insulative frame and between adjacent ones of the half bridges; and a second busbar attached to the part of the second structured metal frame exposed by the plurality of second openings in the electrically insulative frame, wherein the second busbar electrically interconnects the source or emitter terminal of the one or more low-side power semiconductor dies of each half bridge circuit.

12. The power semiconductor module of claim 11, wherein the first busbar comprises a plurality of tabs received by the plurality of first openings in the electrically insulative frame and attached to the part of the first structured metal frame exposed by the plurality of first openings in the electrically insulative frame, and wherein the second busbar comprises a plurality of tabs received by the plurality of second openings in the electrically insulative frame and attached to the part of the second structured metal frame exposed by the plurality of second openings in the electrically insulative frame.

13. The power semiconductor module of claim 11, further comprising:

at least one lid attached to a surface of the electrically insulative frame with the plurality of first openings and the plurality of second openings, wherein the at least one lid and the electrically insulative frame form an enclosure for the plurality of half bridge circuits, wherein the first busbar and the second busbar are embedded in the at least one lid, interposed between the at least one lid and the electrically insulative frame, or disposed above the at least one lid.

14. The power semiconductor module of claim 13, wherein the first busbar and the second busbar are vertically stacked one above the other and dielectrically insulated from one another.

15. The power semiconductor module of claim 14, wherein the plurality of first openings in the electrically insulative frame is disposed on a first side of a longitudinal centerline that runs between the opposing first and second sidewalls of the electrically insulative frame, wherein the plurality of second openings in the electrically insulative frame is disposed on a second side of the longitudinal centerline opposite the first side, wherein on the first side of the longitudinal centerline, the first busbar is attached to the part of the first structured metal frame exposed by the plurality of first openings in the electrically insulative frame, and wherein on the second side of the longitudinal centerline, the second busbar is attached to the part of the second structured metal frame exposed by the plurality of second openings in the electrically insulative frame.

16. The power semiconductor module of claim 13, wherein the first busbar and the second busbar are laterally spaced apart from one another.

17. The power semiconductor module of claim 16, wherein the plurality of first openings in the electrically insulative frame is disposed on a first side of a longitudinal centerline that runs between the opposing first and second sidewalls of the electrically insulative frame, wherein the plurality of second openings in the electrically insulative frame is disposed on a second side of the longitudinal centerline opposite the first side, wherein the first busbar is disposed above the plurality of first openings in the electrically insulative frame, and wherein the second busbar is disposed above the plurality of second openings in the electrically insulative frame.

18. The power semiconductor module of claim 1, wherein the electrically insulative frame comprises a separate frame subunit for each half bridge circuit, and wherein the frame subunits are attached to one another.

19. The power semiconductor module of claim 1, wherein the first structured metal frame and the second structured metal frame are arranged side-by-side as a single structured part.

20. A power semiconductor module, comprising:

an electrically insulative frame;

a half bridge circuit housed in the electrically insulative frame and comprising one or more high-side power semiconductor dies and one or more low-side power semiconductor dies;

a first structured metal frame embedded in the electrically insulative frame and electrically connected to a drain or collector terminal of the one or more high-side power semiconductor dies;

a second structured metal frame embedded in the electrically insulative frame and electrically connected to a source or emitter terminal of the one or more low-side power semiconductor dies;

a plurality of first openings in the electrically insulative frame that expose part of the first structured metal frame or part of the second structured metal frame at opposing first and second sidewalls of the electrically insulative frame;

a first busbar attached to the part of the first structured metal frame or the part of the second structured metal frame exposed by the plurality of first openings in the electrically insulative frame; and a lid attached to a surface of the electrically insulative frame with the plurality of first openings, wherein the lid and the electrically insulative frame form an enclosure for the half bridge circuit, wherein the first busbar is embedded in the lid, interposed between the lid and the electrically insulative frame, or disposed above the lid.

21. The power semiconductor module of claim 20, wherein the plurality of first openings in the electrically insulative frame expose part of the first structured metal frame at the opposing first and second sidewalls of the electrically insulative frame, and wherein the first busbar electrically interconnects the drain or collector terminal of the one or more high-side power semiconductor dies.

22. The power semiconductor module of claim 21, further comprising:

a plurality of second openings in the electrically insulative frame that expose part of the second structured metal frame at the opposing first and second sidewalls of the electrically insulative frame; and a second busbar attached to the part of the second structured metal frame exposed by the plurality of second openings in the electrically insulative frame, wherein the second busbar electrically interconnects the source or emitter terminal of the one or more low-side power semiconductor dies.

23. The power semiconductor module of claim 22, wherein the first busbar and the second busbar are embedded in the lid, interposed between the lid and the electrically insulative frame, or disposed above the lid.

24. A power electronics device, comprising:

a power semiconductor module comprising:

an electrically insulative frame;

a plurality of half bridge circuits housed in the electrically insulative frame and each comprising one or more high-side power semiconductor dies and one or more low-side power semiconductor dies;

a first structured metal frame embedded in the electrically insulative frame and electrically connected to a drain or collector terminal of the one or more high-side power semiconductor dies of each half bridge circuit;

a second structured metal frame embedded in the electrically insulative frame and electrically connected to a source or emitter terminal of the one or more low-side power semiconductor dies of each half bridge circuit;

a plurality of first openings in the electrically insulative frame that expose part of the first structured metal frame or part of the second structured metal frame at opposing first and second sidewalls of the electrically insulative frame and between adjacent ones of the half bridge circuits;

a first busbar attached to the part of the first structured metal frame or the part of the second structured metal frame exposed by the plurality of first openings in the electrically insulative frame; and at least one lid attached to a surface of the electrically insulative frame with the plurality of first openings, wherein the at least one lid and the electrically insulative frame form an enclosure for the plurality of half bridge circuits, wherein the first busbar is embedded in the at least one lid, interposed between the at least one lid and the electrically insulative frame, or disposed above the at least one lid; and a DC link capacitor having a first terminal electrically connected to the drain or collector terminal of the one or more high-side power semiconductor dies of each half bridge circuit and a second terminal electrically connected to the source or emitter terminal of the one or more low-side power semiconductor dies of each half bridge circuit.

25. The power electronics device of claim 24, wherein the plurality of first openings in the electrically insulative frame expose part of the first structured metal frame at the opposing first and second sidewalls of the electrically insulative frame and between adjacent ones of the half bridge circuits, and wherein the first busbar electrically interconnects the drain or collector terminal of the one or more high-side power semiconductor dies of each half bridge circuit.

26. The power electronics device of claim 25, further comprising:

a plurality of second openings in the electrically insulative frame that expose part of the second structured metal frame at the opposing first and second sidewalls of the electrically insulative frame and between adjacent ones of the half bridge circuits; and a second busbar attached to the part of the second structured metal frame exposed by the plurality of second openings in the electrically insulative frame, wherein the second busbar electrically interconnects the source or emitter terminal of the one or more low-side power semiconductor dies of each half bridge circuit.

* * * * *